(12) United States Patent
Atwood

(10) Patent No.: US 7,218,128 B2
(45) Date of Patent: May 15, 2007

(54) METHOD AND APPARATUS FOR LOCATING AND TESTING A CHIP

(75) Inventor: Eugene Atwood, Housatonic, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,306

(22) Filed: Feb. 14, 2005

(65) Prior Publication Data

US 2006/0181291 A1   Aug. 17, 2006

(51) Int. Cl.
*G01R 31/02* (2006.01)
(52) U.S. Cl. ............... 324/758; 324/755; 324/158.1
(58) Field of Classification Search .................... None
See application file for complete search history.

(56) References Cited

U.S. PATENT DOCUMENTS

| | | | | |
|---|---|---|---|---|
| 3,862,790 | A * | 1/1975 | Davies et al. | 439/66 |
| 4,003,621 | A * | 1/1977 | Lamp | 439/586 |
| 4,371,912 | A * | 2/1983 | Guzik | 361/684 |
| 5,014,161 | A * | 5/1991 | Lee et al. | 361/709 |
| 5,129,874 | A * | 7/1992 | Hayes et al. | 493/167 |
| 5,172,050 | A * | 12/1992 | Swapp | 324/762 |
| 5,247,250 | A * | 9/1993 | Rios | 324/754 |
| 5,596,282 | A * | 1/1997 | Giddings et al. | 324/754 |
| 5,606,263 | A * | 2/1997 | Yoshizawa et al. | 324/761 |
| 5,673,799 | A * | 10/1997 | Braden | 209/574 |
| 5,680,057 | A * | 10/1997 | Johnson | 324/757 |
| 5,690,281 | A * | 11/1997 | Ikeya et al. | 439/268 |
| 6,002,266 | A | 12/1999 | Briggs et al. | |
| 6,018,249 | A * | 1/2000 | Akram et al. | 324/758 |
| 6,033,235 | A * | 3/2000 | Ikeya | 439/71 |
| 6,077,091 | A * | 6/2000 | McKenna-Olson et al. | 439/71 |
| 6,083,013 | A * | 7/2000 | Yamagishi | 439/71 |
| 6,242,932 | B1 * | 6/2001 | Hembree | 324/755 |
| 6,292,003 | B1 * | 9/2001 | Fredrickson et al. | 324/754 |
| 6,333,638 | B1 * | 12/2001 | Fukasawa et al. | 324/765 |
| 6,400,174 | B2 * | 6/2002 | Akram et al. | 324/765 |
| 6,462,533 | B1 * | 10/2002 | Shimizu | 324/158.1 |
| 6,529,027 | B1 * | 3/2003 | Akram et al. | 324/758 |
| 6,575,767 | B2 * | 6/2003 | Satoh et al. | 439/71 |
| 6,710,611 | B2 * | 3/2004 | Saulnier et al. | 324/755 |
| 6,863,541 | B2 * | 3/2005 | Kagami | 439/71 |
| 6,924,656 | B2 * | 8/2005 | Matsumoto | 324/758 |
| 6,925,782 | B2 * | 8/2005 | Aylward | 53/475 |
| 6,970,008 | B2 * | 11/2005 | Lu | 324/765 |

\* cited by examiner

*Primary Examiner*—Ernest Karlsen
(74) *Attorney, Agent, or Firm*—Daryl K. Neff; H. Daniel Schnurmann

(57) ABSTRACT

A probe apparatus includes a nest element operable to precisely locate a chip having a plurality of exposed interconnects on a face of the chip to permit conductive connection to the chip through the interconnects. The nest element includes a pocket dimensioned to locate the chip within a tolerance of less than a width of one of the interconnects, and tapered walls extending upwardly and outwardly from the pocket, the tapered walls adapted to guide the chip into the pocket. One or more piezoelectric elements can be attached to or provided within to the nest element to impart vibration to the nest element, causing the chip to be "fluidized" such that the chip is guided into the pocket under the force of gravity or other externally applied force.

23 Claims, 5 Drawing Sheets

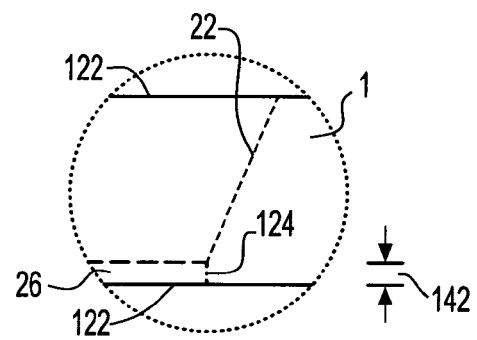
FIG. 2B
FIG. 2A
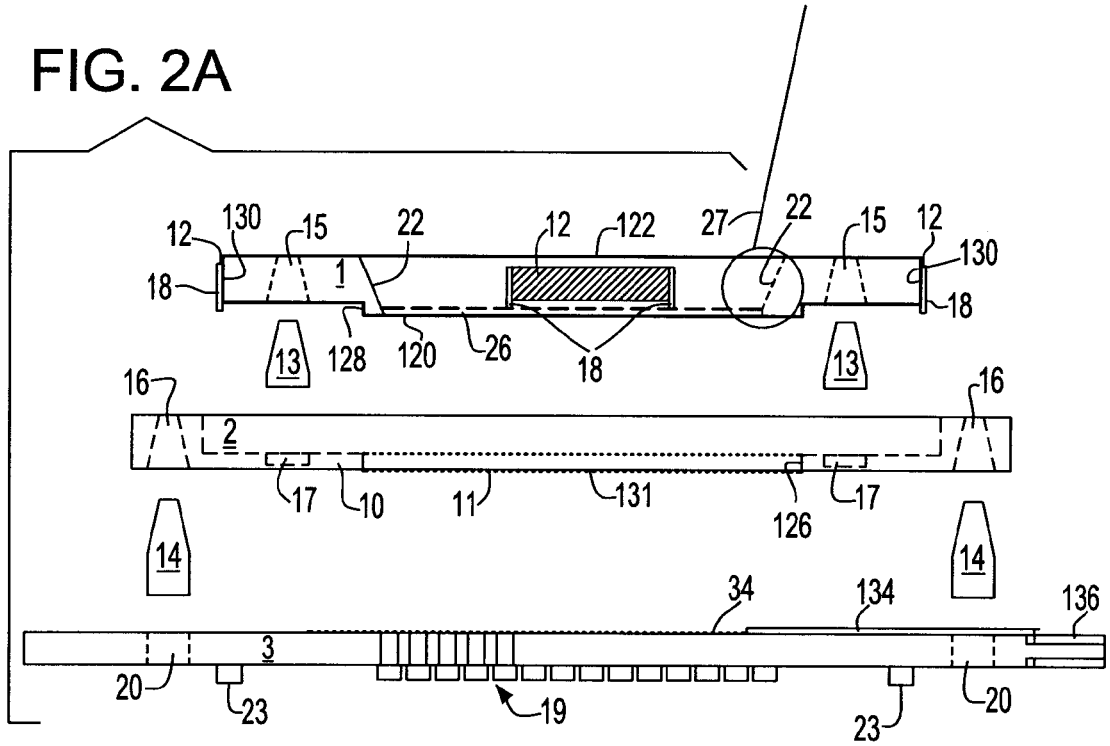

FIG. 3A
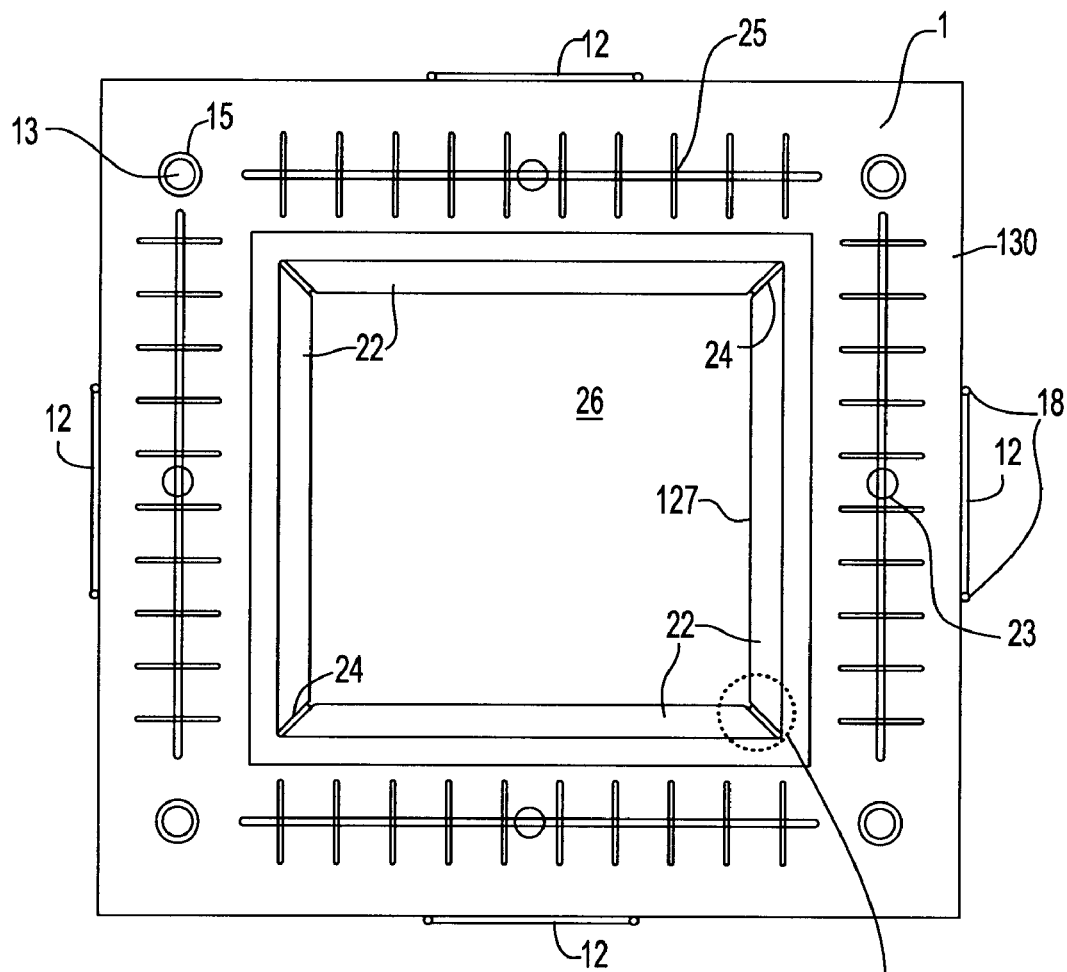
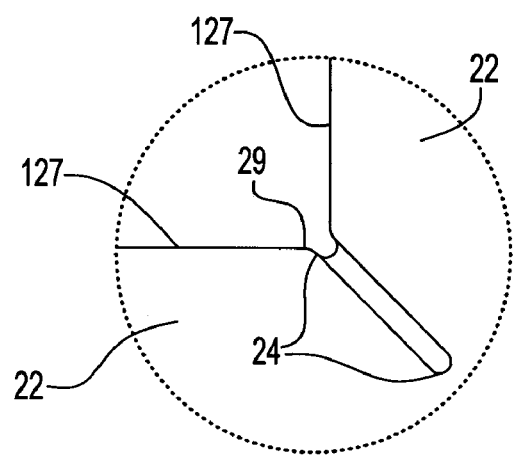
FIG. 3B

METHOD AND APPARATUS FOR LOCATING AND TESTING A CHIP

BACKGROUND OF THE INVENTION

The present invention relates to a device and method for use in electrically testing a chip.

With each new generation of integrated circuit technology, the number and the density of circuits increase on an integrated circuit. An integrated circuit is also referred to herein as a "chip" or a "die". Not surprisingly, the number and the density of external interconnects to a chip tends to increase with the circuit density, to support increased data bandwidth, and in large part to provide sufficiently low impedance connections to supply power to internal locations of the chip. To help address the requirements for testing chips of increased complexity, built-in-self-test techniques have been developed which reduce the memory and speed requirements of automatic test equipment. However, the increased complexity has caused test time durations to increase substantially. Thus, methods to enable a lower cost test environment have been shifting gradually away from reliance on automatic test equipment and towards reduced pin test equipment which interfaces to the chip through a subset of the chip's external pins.

One chip packaging technology, which supports tightly pitched external interconnects, is known as "controlled collapse chip connection" (i.e., "C4"). The C4 process refers to the manner in which parallel disposed solder bumps formed on an external array of bond pads of the chip, are simultaneously joined to corresponding solder-wettable contact pads of the package element by "reflowing" (i.e., by melting and re-solidification of) the solder bumps to join the bumps to the contact pads of the package element.

While chip packaging systems have kept pace with the increasing density of external interconnects, it has become increasingly difficult to electrically test a bare (unpackaged) chip through its external interconnects. Wafer-level testing has provided a way of testing the functionality of chips before they are even severed from the wafer. Typically, a wafer-level tester has a stepper which steps to one chip location of the wafer, establishes conductive contact to external interconnects of that chip location, and conducts electrical testing at that chip location. Then, the stepper steps to another chip location of the wafer, establishes conductive contact to the other chip location, conducts testing at that chip location, and then repeats the same steps again for another chip location of the wafer.

Alignment in four (4) dimensions is automatically performed for each new wafer. The stepper can then step from one chip location to another automatically and conserve time by eliminating the time required to align the tester to individual chip locations in turn. However, when the test performed on a chip at each chip location is very time-consuming, an economic trade-off is made between the cost of the test and the extent of test coverage achieved for each chip location, the test coverage being a function of the time allotted to the test. Often, for the complex devices considered here, such systems are unable to test more than one chip location of the wafer at the same time due to power delivery and power dissipation issues. One major cost factor comes about because expensive equipment is required to align the external interconnects of a chip of the wafer to a matching wafer probe for testing. Another major cost factor is the test equipment which generally is in the class of equipment referred to as Automatic Test Equipment (ATE). Such equipment has multiple capabilities which result in the equipment being costly, particularly when used to test only one chip location of the wafer at a time.

On the other hand, for chips which are relatively less complex (e.g., chips which are usually smaller, have fewer input/output (I/O) connections and operate at lower power), multiple chip locations can be tested simultaneously in parallel to reduce the cost of testing each chip by a factor equal to the number of chip locations tested in parallel. Except for such less complex chips, testing must either be performed one chip location at a time using an expensive wafer prober and test equipment and/or testing must be performed on individual chips after the wafer has been severed into individual chips.

Heretofore, the time and expense required to align an individual chip of relatively high complexity to a test probe has been costly. Costly precision equipment, similar to that used on wafer probers, has been used to achieve correct alignment to establish conductive contact between the external interconnects of the chip and a probe interface. For relatively complex chips, one alternative has been to mount individual chips to temporary packages, test the chips as mounted to the temporary packages, i.e., via functional and/or burn-in tests, and then remove the temporary packages after the tests. The chips which show good test results are then mounted to final packages. Clearly, it would be desirable to eliminate the time and expense required to mount and remove temporary packages to test individual chips of relative complexity.

For these reasons, it would be desirable to provide a new way of testing individual "bare" chips, i.e., unpackaged chips, after wafers have been severed into individual chips, using equipment that is capable of accurately aligning the external interconnects of the bare chip to a probe interface without requiring costly precision alignment methods.

U.S. Pat. No. 6,002,266 to Briggs et al. ("the Briggs Patent") describes a test socket for a chip which has sloped sidewalls. When placed in the socket, the edges of the chip rest against the sloped sidewalls. At best, the sloped sidewalls of the socket imprecisely align the chip within the socket because the chip remains free to move up and down along the sloped sidewalls. The socket described in the Briggs Patent falls short of locating a chip in a sufficiently precise manner to align fine pitch interconnects (e.g., C4 interconnects) of a chip to a mating array of probe contacts.

Recent advances in C4 process technology provide more tightly controlled tolerances, including tolerances specifying the placement of the bond pads on the chip relative to the edge of the chip. For example, the positional tolerance of bond pads of the chip has now been reduced to as low as 1 mil (i.e., 0.001 inch). With more tightly controlled tolerances, it would be desirable to provide a way of aligning or locating a chip within a retaining member of an electrical testing apparatus which does not require costly equipment or a large amount of time to perform.

SUMMARY OF THE INVENTION

According to one aspect of the invention, a probe apparatus includes a nest element operable to precisely locate a chip having a plurality of exposed interconnects on a face of the chip to permit conductive connection to the chip through the interconnects. The nest element of the probe apparatus includes a pocket dimensioned to locate the chip within a tolerance of less than a width of one of the interconnects. The nest element has tapered walls extending upwardly and outwardly from the pocket, the tapered walls adapted to guide the chip into the pocket. One or more piezoelectric elements can be attached to an external surface of the nest element or mounted within the nest element to impart vibration to the nest element, causing the chip to be fluidized within the nest element, such that the chip is guided into the pocket. Preferably, this results in the interconnects of the chip resting against corresponding contacts of the probe apparatus. For example, when the pocket lies at the bottom of the tapered nest element, the chip can be guided downwardly into the pocket under the force of gravity. In another example, the nest element may be placed in an alternative position in which the pocket is at the top of the nest element or at one side of the nest element. Once the chip is located within the tapered nest element, a force is applied to the exposed side of the chip to push the chip towards the pocket and subsequently to its desired final location deep within the pocket. As one example, such force can be applied by a spring, a hydraulic actuator or other mechanism.

According to another aspect of the invention, a method is provided for locating a chip. Such method permits conductive connection to be established to the chip through a plurality of interconnects exposed on a face of the chip. According to such method, the chip is placed within a nest element including a pocket dimensioned to locate the chip within a tolerance of less than half a width of one of the interconnects. Tapered walls of the nest element extend upwardly and outwardly from the pocket, the tapered walls being adapted to guide the chip into the pocket.

According to a preferred aspect of the invention, the method further includes clamping the nest element to a probe element having conductive contacts aligned to the pocket. A vibratory motion is imparted to the nest element to fluidize the chip to be guided into the pocket under the force of gravity or other force, such force being exerted, e.g., by a spring, hydraulic actuator or other mechanism, etc., in a direction to move the chip towards the pocket and the chip is pressed against the probe element to establish conductive contact between interconnects of the chip and the conductive contacts. Voltages are applied and currents are then flowed through the conductive contacts and the interconnects to test the chip.

According to another aspect of the invention, a method is provided for simultaneously testing a plurality of chips. In such method, a plurality of probe apparatuses are arranged in an array, e.g., a row or vertical stack of rows, in which each probe apparatus includes a nest element having a pocket dimensioned to locate one chip within a tolerance of less than a width of one of a plurality of exposed interconnects of the chip. Each nest element has tapered walls extending upwardly and outwardly from the pocket and adapted to guide the chip into the pocket. The probe apparatuses further include probe elements having conductive contacts aligned to the pockets.

In such method, chips are placed with at least coarse alignment into the nest elements of respective ones of the plurality of probe apparatuses. Vibratory motion is then imparted to the probe apparatuses to guide the chips into the pockets of the probe apparatuses, after which the chips are clamped to the respective probe elements to establish conductive contact between the interconnects of the chips and the conductive contacts of the probe elements. Voltages are then applied and currents are then flowed simultaneously through the conductive contacts of at least some of the probe apparatuses and the interconnects of at least some of the chips to simultaneously test at least some of the chips.

BRIEF DESCRIPTION OF THE DRAWINGS

FIG. 2A is an exploded side elevational view of a probe socket assembly in accordance with an embodiment of the invention.

FIG. 2B is a partial enlarged side elevational view illustrating in detail a tapered wall and a pocket of a nest element according to an embodiment of the invention.

FIG. 3A is a top plan view of a nest element according to an embodiment of the invention.

FIG. 3B is a partial enlarged top plan view illustrating in detail a hollowed corner of a pocket of a nest element according to an embodiment of the invention.

DETAILED DESCRIPTION

Long test times needed to most completely test chip quality must be balanced against equipment costs. By lowering the costs of the automatic test equipment and the means by which a chip may be interfaced for testing an opportunity is created for producing higher quality chips at lower cost. This invention describes a novel chip socket which avoids the costs associated with: wafer probing equipment and precision chip-placing equipment, because the chip socket does not require the chip to be precisely placed therein. Additionally, the socket provides the means to enable low inductance power delivery, efficient thermal heat dissipation and, as required, high speed interconnects to the product under test.

Figure 1:
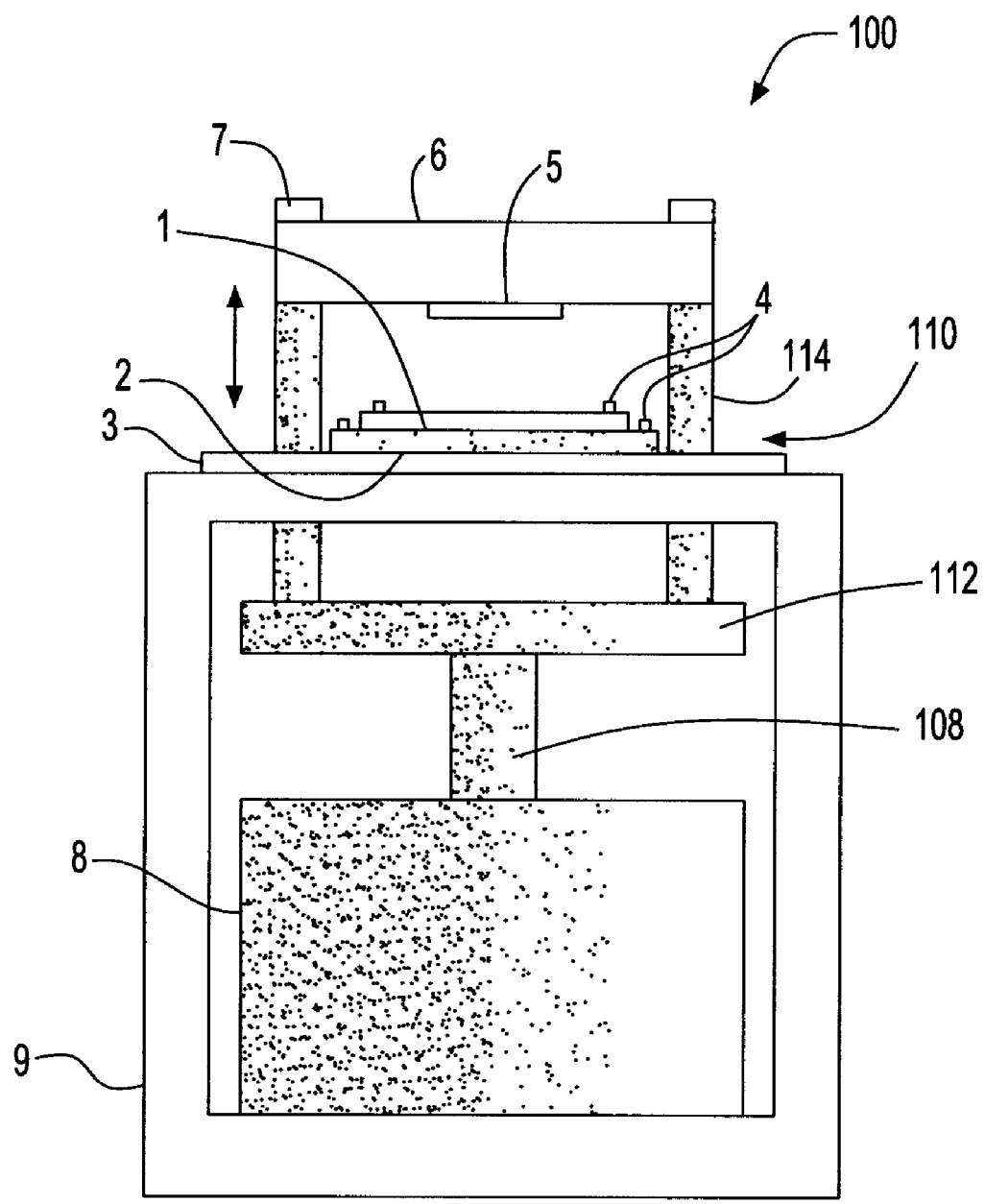
FIG. 1 is a side elevational view illustrating a probe apparatus according to an embodiment of the invention.

FIG. 1 is a side elevational view illustrating a probe apparatus 100 according to an embodiment of the invention, the probe apparatus 100 being used to test one chip at a time. As shown in FIG. 1, the probe apparatus includes a support frame 9 to which a double-acting pneumatic actuator 8 is mounted. The actuator 8 includes a movable arm 108, to which a movable box-frame 110 including a platform 112 and columns 114 is mounted. The box frame 110, in turn, is attached to a temperature-controlling block or carriage 6, to which a chip-contacting back plate 5 is mounted. The back plate 5 preferably includes one or more fluid distribution channels for placement adjacent to the rear surface of the chip, the back plate being adapted to carry a liquid under pressure to cool or heat the chip, respectively. A second fluid distinct from the temperature-controlled fluid can be introduced into the interfacial region between the chip and the back plate to decrease the interface thermal resistance and/or to directly remove heat from the chip. Typically, helium is used as a second fluid in the interfacial region to lower the thermal resistance between the chip and the back plate. Also, the back plate 5 preferably includes one or more vacuum distribution channels for the purpose of maintaining the back plate in close contact with the chip. The removal of the second fluid can be accomplished by a set of lower pressure fluid orifices or by using vacuum scavenging. The helium or fluid distribution channels may be open to the surface of the chip such that the helium or fluid carried by them contacts the surface of the chip. In such case, excess helium or fluid which bleeds from the interfacial region between the back plate and the rear surface of the chip is scavenged by the vacuum distribution channel. The back plate is thermally connected to the temperature-controlling block, and temperature-controlled fluid is circulated through the back plate to effect removal of heat.

Movement of the arm 108 of the actuator 8, the box-frame 110 mounted thereto, and the carriage 6 and back plate 5 carried thereby are provided by controlling and observing pressures within the double-acting actuator 8. Such movement is preferably observed in fine increments, especially minute stepwise increments by a linear encoder (not shown). In addition, the probe apparatus includes a gimbaling mechanism 7 operable to permit a plane of the carriage 6 and the back plate 5 to be aligned in parallel with a plane of a chip inserted into the probe apparatus, as described below.

The probe apparatus 100 further includes a nest element 1 which is sized and shaped to locate a chip. The nest element is removably clamped to a probe frame of a probe element 2, the probe element in turn being removably clamped to an interconnect element 3. The interconnect element can be a printed circuit board or substrate, e.g., of ceramic material, for example, having wiring and terminals provided on the exterior surface of the element. The probe element 2 includes corresponding outer contacts aligned to the terminals, as well as a set of upwardly facing inner contacts connected to the outer contacts, the inner contacts arranged to contact the interconnects of the chip. Together, the probe element and the interconnect element provide conductive interconnection to the chip from circuits exterior to the interconnect element. As further shown in FIG. 1, alignment is maintained between the nest element, the probe element and the interconnect element through a set of tapered guide pins 4 extending into the nest element and the probe element. In a particular embodiment, described more fully below, the probe element 2 is vacuum clamped to the interconnect element 3 and the nest element 1 is vacuum clamped to the probe element 2.

In operation, after aligning and clamping the nest element to the probe element and aligning and clamping the probe element to the interconnect element, a chip (not shown) is placed within the nest element such that the interconnect-bearing face of the chip is oriented downwardly towards the probe element 2. The chip is placed "coarsely" within the nest element 1, and is preferably placed within a modest (loose) angular tolerance of the correct axial alignment of chip to the probe element, such that the chip's exterior margin is contained within the outline of the nest element. For example, a tolerance of 5–10 degrees is easily achieved by a person manually placing the chip within the nest element and a tolerance of less than one degree can be easily achieved by a simple low-precision mechanical placement tool. The loose tolerance permitted through use of the nest element and probing apparatus in accordance with embodiments of the invention compares to an extraordinarily precise tolerance needed to directly place a chip in correct alignment to a probing device by conventional methods. In a conventional method, assuming that the centermost interconnect of a 20 mm square chip is aligned, the chip having 4 mil size interconnects at an 8 mil pitch, the required tolerance to directly place the chip via such conventional method is approximately one thousandth (0.001) of one degree.

As shown in the elevational view of FIG. 2A and in the enlarged partial sectional view of FIG. 2B, the nest element has a set of tapered walls 22 within which the chip comes to rest after being placed in the nest element 1. After being placed with coarse alignment in the nest element 1, the chip is subsequently caused to be guided into a small, tight tolerance pocket 26 of the nest element 1 below the tapered walls 22. This is done by imparting a vibratory motion to the nest element to "fluidize" the chip, i.e., to vibrate the chip to overcome the force of friction, such that the tapered walls of the nest element can freely guide the chip towards and into the pocket 26 of the nest element 1. In one example, while the chip is "fluidized", the chip is guided downwardly under the force of gravity into the pocket, the pocket being disposed below the tapered walls of the nest element. In another embodiment, the tapered walls of the nest element are disposed at a lower position below the pocket, such that when the chip is fluidized by the vibration, the chip is guided upwardly into the pocket under an upwardly directed force, as applied thereto by a spring or pneumatic or hydraulic actuator, for example. To implement such embodiment, for example, the structure shown in FIG. 1 could be inverted such that the back plate 5 of the probe apparatus 100 faces up towards the rear surface of the chip. Likewise, if the pocket is disposed at one side of the nest element, the chip can be guided into the pocket under an external force directed in a sideways direction by a spring or pneumatic or hydraulic actuator, for example. In this case, to implement such embodiment, the structure shown in FIG. 1 could be placed on its side.

As a result of the chip being guided into the pocket, the interconnects of the chip are caused to be aligned with the corresponding inner contacts of the probe element. Thereafter, the actuator 8 moves the carriage 6 carrying the back plate 5 downwardly towards the back face of the chip (not shown) which rests within the nest element 1. The gimbaling mechanism 7 adjusts to assure a parallel plane of contact between the back plate 5 and the back face of the chip, after which the carriage 6 is further moved downwardly until the chip establishes conductive contact between the interconnects on the front face of the chip and the inner contacts of the probe element. Thereafter, voltages and currents can be applied or flowed into and out of the interconnects of the chip for test purposes. In a particular embodiment, the chip is capable of being energized and tested for a variety of operational functions. For example, a set of external operational tests as well as built-in-self-tests (BISTs) can now be performed with the chip temporarily mounted to the probe apparatus 100 for testing.

As a high-throughput alternative to wafer-level testing, a robotic pick-and-place mechanism or "placer" can be used to place chips in a probe apparatus or in each of a number of probe apparatuses 100 arranged in a manner consistent with test equipment tooling and the robotic placer. For example, the probe apparatuses can be arranged in an array such as a linear row or a part circular row or whole circular row, the shape being selected according to the motion of the robotic placer. The probe apparatuses can even be arranged in multiple rows which are vertically stacked one row over another, or be arranged in a vertically stacked column. Here, the robotic placer need not have high precision, since chips need only be coarsely placed within the probe apparatus. In this way, a number of chips can be simultaneously tested by the group of probe apparatuses, with the robotic placer moving a chip to each probe apparatus and subsequently removing the chip therefrom after it is tested. In one example, the amount of motion and time needed to place each chip can be reduced by having the robotic placer carry a number of chips to be tested in a feed mechanism, and the chips be ejected by the robotic placer from the feed mechanism one at a time into each probe apparatus in the row. After testing, chips which show good test results, i.e., those referred to as "tested good" chips, can be taken up by the robotic placer into a take-up mechanism carried by the robotic placer, which can have a similar operation to that of the feed mechanism, except that it operates in reverse. Chips which do not show good test results, i.e., "tested bad" chips, can be moved by the robotic placer to a designated location for further disposal. Alternatively, tested bad chips can be taken up by the robotic placer into a second take-up mechanism designated therefor.

FIG. 2A is an exploded elevational view further illustrating the relationship between the nest element 1, probe element 2 and interconnect element 3. As shown in FIG. 2A and in the enlarged view of FIG. 2B, the nest element 1 includes parallel front and back surfaces 120, 122, between which a pocket 26 is disposed. The nest element 1 preferably has a rigid structure which is thermally stable through the useful operating temperature range and "stressed" operating temperature range of the chip. Stated another way, the nest element 1 is preferably stable over the maximum temperature range that the chip may encounter during normal operation or under stressed temperature conditions. Preferably, the nest element 1 is constructed of a high-temperature polymer having a high-glass transition temperature. Optionally, the nest element can be constructed of other suitable materials such as a metal, e.g., aluminum, or a material having a matching coefficient of thermal expansion ("CTE") to the probe element 2, the wiring substrate 3 and the chip, such as glass, ceramic, composite structures containing, for example, molybdenum or a nickel alloy. Such CTE matching improves lateral dimensional stability, when the probe apparatus is used for maintaining electrical connection to the chip while thermally cycling the chip. The pocket 26, having vertical or substantially vertical pocket walls 124, is sized and shaped to locate a chip having a desired size and shape. Preferably, the pocket has length and width which are greater than the length and width of the chip by less than one half the size of the exposed interconnect of the chip. For example, when the lateral dimension of an interconnect on the chip, e.g., a solder bump, is 4 mils, the interior length of the pocket is preferably greater than the length of the chip by 1 to 2 mils, and the interior width of the pocket is preferably greater than the width of the chip by 1 to 2 mils. Likewise, if the lateral dimension of the interconnect become smaller, for example, 3 mils, each interior dimension of the pocket is preferably greater than the corresponding dimension of the chip by 1.0 to 1.5 mils.

Preferably, the pocket 26 has height 142 which is less than the thickness between the front (interconnect-bearing) and rear (opposite) surfaces of the chip, but is sufficient to provide a positive locating influence to the chip. In one embodiment, the pocket has height between 50% and 75% of the thickness of the chip. From the pocket 26, a set of tapered walls 22 extend upwardly and outwardly, the tapered walls adapted to guide the chip into the pocket 26. As best shown in the top (chip-facing) view of FIG. 3A and the enlarged view of FIG. 3B, the tapered walls 22 of the nest element are joined at hollowed corners 29 having a relaxed radius. Grooves 24 extend outwardly from the corners 29 between adjacent tapered walls 22. In addition, the vertical perimeter walls 124 (FIG. 2B) of the pocket 26 define perimeter edges 127 of the pocket 26 where the pocket is joined to the tapered walls 22 of the nest element 1. These edges between the tapered walls 22 and the pocket walls 124 are radiused, as well. Since chips are severed from a wafer by sawing, cracking and/or cleaving, the chip cannot be assured to have straight and burr-free corners and edges. The purpose of the grooves, the hollowed corners and the radiused edges of the nest element is to avoid the corners and edges of the chip from binding at the corners and the edges of the nest element. This avoids such burrs from hindering the chip from traveling into the pocket.

As further shown in FIG. 2A, the nest element includes guide pin registration holes 15 positioned and sized to accept guide pins 13, the guide pins extending upwardly from guide pin retainers 17 disposed in the probe element 2. The locations of the guide pins and the registration holes are also apparent in FIG. 3A. When the nest element 1 is assembled to the probe element 2 and clamped in place thereto, the guide pins and the guide pin registration holes hold the nest element in registration with the probe element. As further shown in FIG. 2A, and as best shown in FIG. 3A, the nest element further includes a plurality of vibration imparting elements 12, for example, piezoelectric devices, the piezoelectric devices 12 having exterior conductive connectors 18 exposed at exterior edges 130 of the nest element 1. In one embodiment, the vibration-imparting elements are attached to exterior surfaces of the nest element. In another embodiment, the vibration-imparting elements are mounted within openings in the nest element, with electrical connections exposed at a surface of the nest element, for example, the bottom surface. In operation, the piezoelectric devices impart vibration to the nest element, fluidizing the chip within it, to help guide the chip down the tapered interior walls 22 of the nest element into the pocket 26. As further shown in FIG. 3A, vacuum nibs 23 and vacuum distribution channels 25 are disposed on the bottom surface of the nest element, i.e., the surface opposite the top surface from which the tapered sidewalls 22 extend towards the pocket 26. The vacuum nibs and the distribution channels 25 distribute a vacuum over a large surface of the nest element so as to clamp the nest element to the probe element disposed below it.

Figure 4:
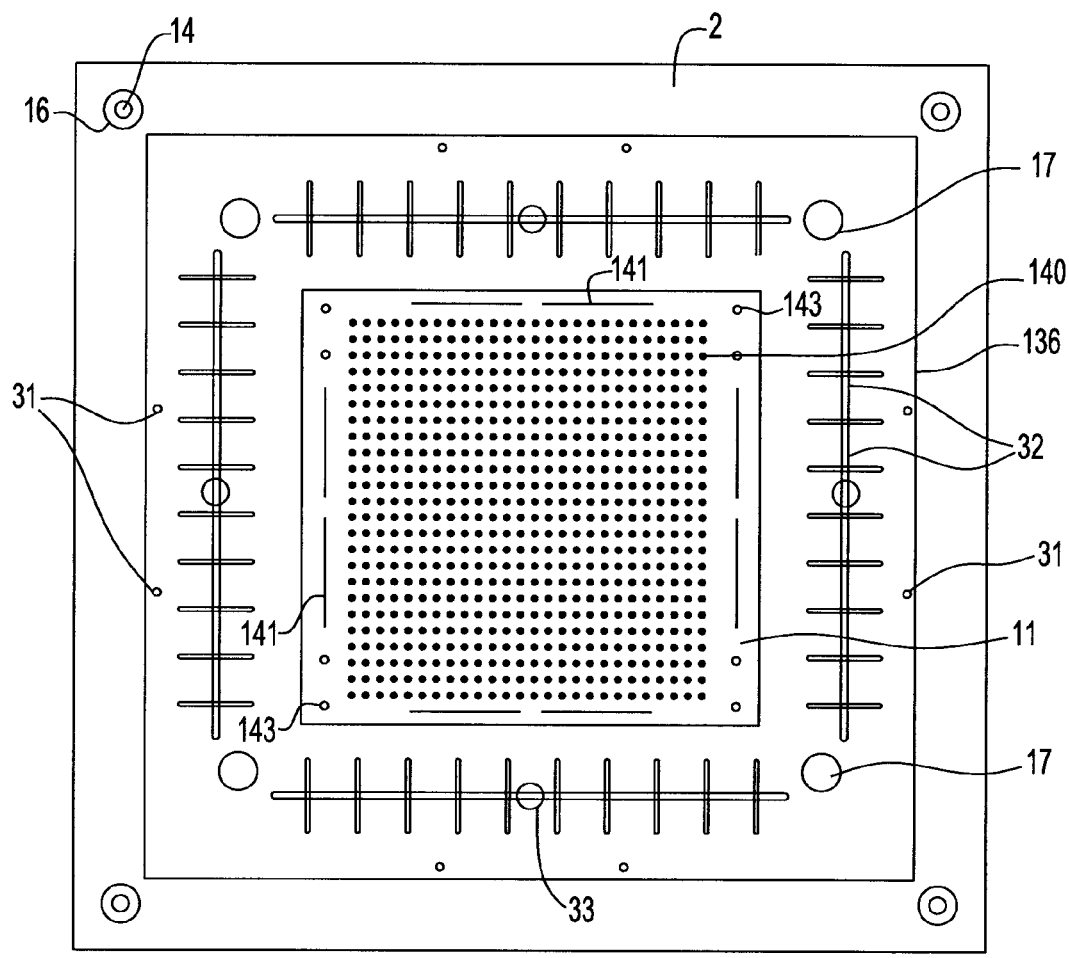
FIG. 4 is a top plan view of a probe element of a probe socket assembly according to an embodiment of the invention.

Referring again to FIG. 2A, the probe element 2 includes a detent 126 which is sized and shaped to accept a pocket frame 128 protruding from the nest element 1, the pocket frame 128 surrounding the pocket 26 of the nest element 1. As shown in FIG. 2A and also in top (chip-facing) plan view of FIG. 4, the probe element 2 includes a probe contactor 11 mounted within a probe frame 10, the probe contactor having an array of inner contacts 140 arranged to conductively contact the interconnects of the chip, once the chip is located within the pocket of the nest element 1. For use in testing chips which have vertically projecting features such as conductive, e.g., solder, bumps, the probe contactor 11 preferably includes a set of vertical stand-offs which are disposed around the periphery of the array of inner contacts 140. The vertical stand-offs can be provided as linearly extending features 141 on the surface of the probe contactor 11, and/or be provided as point features 143. The vertical stand-offs are used to assure that adequate spacing is maintained between the major surface of the chip and the probe contactor 11, such that upwardly projecting features of the chip which have low yield strength such as conductive bumps are not compressed to the point at which they would spread over the surface of the chip and possibly cause unwanted electrical contact between adjacent features of the chip. In one example of testing, the interconnects of the chip are disposed in an array of bond pads or bond pads having C4 bumps attached, which can be located arbitrarily but are typically located centrally to the chip, or be disposed in a peripheral array in peripheral regions of the chip. The probe element 2 also includes guide pin registration holes 16 which are sized and arranged to accept guide pins 14 extending upwardly from guide pin retainers 20 disposed in the interconnect element 3. The locations of guide pin retainers 17 are also apparent in FIG. 4. Similar to the nest element, as shown in FIG. 4, the probe element includes a plurality of vacuum distribution channels 32 at a bottom surface thereof for clamping the probe element to the interconnect element. In addition, vacuum pass-through ports 33 supply the vacuum to the vacuum distribution channels 25 of the nest element. In addition, the probe element further includes electrical connectors 31 aligned in registration with the electrical connectors 18 of the nest element, the connectors 31 operable to supply currents to the piezoelectric devices 12 of the nest element.

Figure 5:
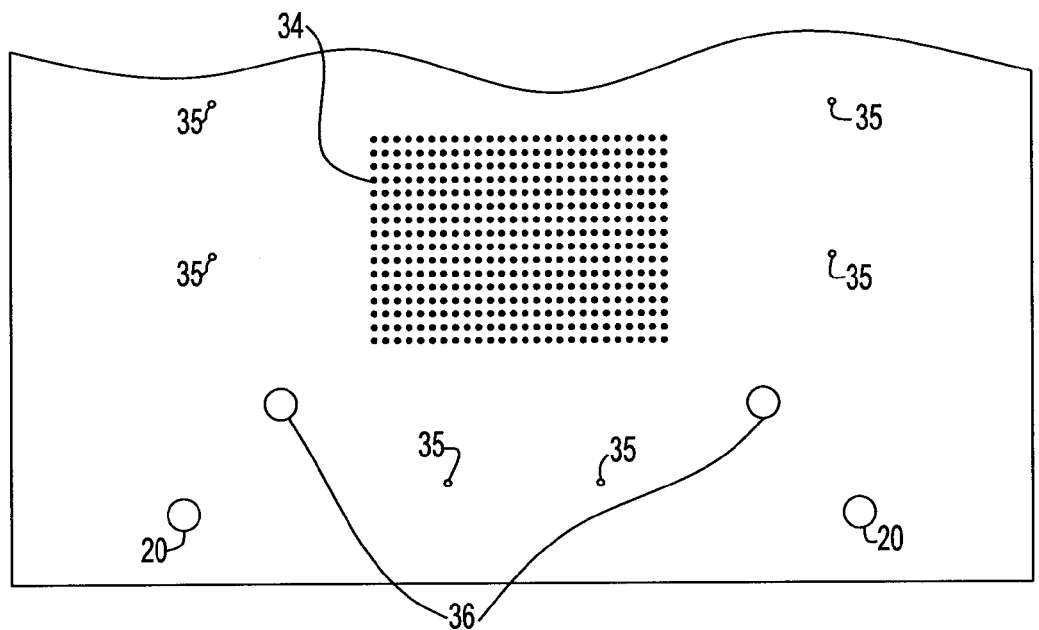
FIG. 5 is a top plan view of an interconnect element of a probe socket assembly according to an embodiment of the invention.

As further shown in FIG. 2A, the interconnect element 3 includes an array of terminals 34 corresponding to outer (bottom surface) contacts 131 of the probe contactor 11, the terminals 34 connected via wiring 134 to an external connector of the interconnect element, for example, an edge connector 136. Like the probe element 2, the interconnect element 3 includes guide pin retainers 20 which are sized and shaped to retain guide pins 14, the guide pins 14 extending upwardly into registration holes 16 of the probe element. The terminals 34 are connected to discrete passive elements 19, especially decoupling capacitors, although such passive elements can include resistors and/or inductors in addition to or instead of capacitors. Alternatively, or in addition thereto, signal and power connections can be made through the terminals 34. Vacuum connection nibs 23 of the interconnect element 3 are further shown in FIG. 2A. A top view of the interconnect element 3 is shown in FIG. 5, which makes apparent the guide pin retainers 20, terminals 34, as well as vacuum pass-through ports 36 and electrical connectors 35 which are adapted to contact corresponding connectors 31 (FIG. 4) of the probe element.

As another example of a probe contactor 11 (FIG. 4), the probe contactor is fabricated of an anisotropic conductive film ("ACF"). Such film has spherical or rod-like conductive particles suspended in a dielectric film, e.g., of polyimide. Such film has a property of conducting in a direction between an upper and a lower surface of the film when compressed between two conductive features. However, an ACF does not conduct in lateral directions because the conductive particles of the film are sufficiently spaced apart to prevent conduction. When the chip is placed and aligned in the probe apparatus and pressed into final position, the ACF of the probe contactor 111 is compressed to permit conduction between the interconnects of the chip and the terminals 34 of the interconnect element 3.

Figure 6:
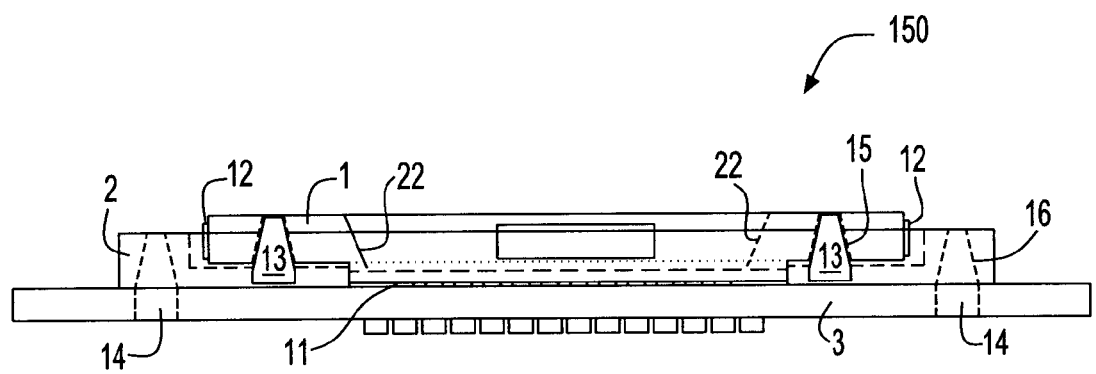
FIG. 6 is a side elevational view of an assembled and clamped probe socket assembly according to an embodiment of the invention.

FIG. 6 is a side elevational view illustrating a condition in which the nest element is clamped in registration with the probe element and the interconnect element. As particularly shown therein, guide pins 14 retained by interconnect element 3 extend into registration holes 16 to maintain registration of the interconnect element to the probe element 2. In addition, the guide pins 13 retained by the probe element 2 extend into registration holes 15 to maintain registration of the probe element to the nest element 1. When the probe assembly 150 including the nest element, probe element and interconnect element are mounted as shown in FIG. 1 to the support frame 9 of a probe apparatus 100, the probe apparatus is ready to accept a chip for testing.

With continued reference to FIG. 6, in operation, a chip is placed by hand or by inexpensive imprecise equipment within the nest element 1 and allowed to rest along the tapered interior walls 22. The piezoelectric devices 12 are then energized, which then imparts a vibration to the nest element which is transferred to the chip. The vibration of the nest element and the chip have a "fluidizing" effect upon the chip, causing it to behave similarly to a fluid "flowing" down the opening defined by the tapered walls of the nest element. As a result, the chip is eventually guided into the pocket 26 where it comes to rest such that the external interconnects of the chip conductively contact the inner contacts 140 (FIG. 4) of the probe element 2. Thereafter, the actuator arm 108 and box-frame 110 are moved downwardly, such that the back plate 5 (FIG. 1) bears down upon the rear face of the chip to establish conductive contact between the interconnects of the chip and the terminals of the interconnect element through the contacts of the probe element. The stand-offs 141 and/or 143 provided on the probe contactor 11 (FIG. 4) maintain a vertical spacing between the major surface of the chip (from which the solder bumps upwardly project) and the surface of the probe contactor 11. This assures that when interconnect features of the chip, e.g., conductive bumps such as solder bumps, have low yield strength, such features are not compressed during probing and testing to the point at which conductive material, e.g., solder, spreads over the major surface of the chip to potentially short-circuit adjacent interconnects of the chip. At that time, heating and/or cooling can be applied through the back plate 5 to the chip through elements provided for that purpose in the carriage 6 (FIG. 1).

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A nest element operable to precisely locate a chip having a plurality of interconnects exposed at a face of the chip to permit conductive connection to the chip through said interconnects, comprising:

a pocket having pocket walls dimensioned to locate the chip within a tolerance of less than a width of one of said interconnects;

a plurality of tapered walls extending upwardly and outwardly from edges of said pocket walls, said tapered walls adapted to receive a chip placed within said nest element and to guide the chip into said pocket under at least one of a force of gravity or an externally applied force; and one or more vibration inducing devices in communication with said nest element, said one or more vibration inducing devices being activatable separately from a process used to place the chip within said nest element and being operable to impart a vibratory motion to the chip through said walls of said nest element to cause the placed chip to be guided along said tapered walls into said pocket.

2. The nest element as claimed in claim 1, wherein said devices include piezoelectric devices.

3. The nest element as claimed in claim 1, wherein said pocket walls are substantially vertical, and said nest element further includes a plurality of hollowed corners having relaxed radius at junctions of said pocket walls.

4. The nest element as claimed in claim 3, wherein a plurality of edges shared by said substantially vertical pocket walls and said tapered walls have relaxed radius.

5. The nest element as claimed in claim 4, further comprising a plurality of exposed grooves extending outwardly from said hollowed corners between adjacent ones of said tapered walls.

6. The nest element as claimed in claim 1, wherein said nest element includes a structure having an opening defining said pocket, said structure consisting essentially of at least one material selected from the group consisting of a polymer having a high class transition temperature, glass, ceramic, and metal.

7. The nest element as claimed in claim 2, further comprising mechanically sprung electrical connectors, said connectors conductively connected to said piezoelectric devices.

8. A probe apparatus including the nest element claimed in claim 1, further comprising:
a probe element having inner contacts facing said interconnects and outer contacts facing away from said interconnects, said interconnects being aligned to the chip-facing contacts when the chip is located by said pocket; and
an interconnect element having wiring traces and a plurality of terminals aligned to said outer contacts to provide conductive interconnection through said probe element to the chip when the chip is located by said pocket.

9. The probe apparatus as claimed in claim 8, wherein said inner contacts of said probe element are shaped to pierce exposed surfaces of said interconnects.

10. The probe apparatus as claimed in claim 8, wherein said pocket is defined by an opening of said nest element, said probe element includes a probe frame aligned to said nest element, and said nest element, said probe frame and said interconnect element including vacuum distribution channels operable to clamp said nest element to said probe element and said probe element to said interconnect element.

11. The probe apparatus as claimed in claim 10, wherein said probe frame and said interconnect element include vacuum ports operable to distribute a vacuum through said interconnect element and said probe element to vacuum distribution channels of said nest element.

12. The probe apparatus as claimed in claim 11, wherein said vacuum ports are adapted to carry a pressurized fluid to said vacuum distribution channels of said nest element to cause said nest element to be released from said probe element.

13. The probe apparatus as claimed in claim 8, further comprising a pressure contactor having a back plate operable to apply a pressure to a rear surface of the chip to establish conductive contact between said interconnects and said inner contacts of said probe.

14. The probe apparatus as claimed in claim 13, wherein said back plate includes at least one vacuum distribution channel for placement adjacent to the rear surface of the chip to apply a vacuum to the rear surface of the chip, and at least one fluid distribution channel for carrying a fluid to the rear surface of the chip to provide said at least one of cooling and heating to the chip, the vacuum distribution channel being operable to scavenge the fluid, the back plate further being operable to eject the chip by maintaining the fluid at a pressure while releasing the vacuum from the rear surface of the chip.

15. The probe apparatus as claimed in claim 13, wherein said back plate is operable to provide at least one of cooling and heating to a rear surface of the chip to control a temperature of the chip.

16. The probe apparatus as claimed in claim 13, further comprising a gimbaling mechanism operable to align a plane defined by said back plate to a plane defined by a rear surface of the chip.

17. A probe apparatus, comprising:
a nest element operable to precisely locate a chip having a plurality of exposed interconnects on a face of the chip to permit conductive connection to the chip through said interconnects, said nest element including a pocket having pocket walls dimensioned to locate the chip within a tolerance of less than a width of one of the interconnects, said nest element having tapered walls extending upwardly and outwardly from edges of said pocket walls to receive a chip placed within said nest element and to guide the chip into said pocket, and one or more vibration inducing devices in communication with said nest element, said one or more vibration inducing devices being activatable separately from a process used to place the chip within said nest element and being operable to impart a vibratory motion to the chip through said walls of said nest element to cause the placed chip to be guided along said tapered walls into said pocket;
a probe element having inner contacts facing said interconnects and outer contacts facing away from said interconnects, the interconnects being aligned to said inner contacts when the chip is located by said pocket; and
an interconnect element having wiring traces and a plurality of terminals aligned to said outer contacts to provide conductive interconnection through said probe element to the chip when the chip is located by said pocket.

18. A method of locating a chip to permit conductive connection to the chip through a plurality of interconnects exposed on a face of the chip, comprising:
placing the chip at least coarsely within a nest element, the nest element including a pocket having pocket walls dimensioned to locate the chip within a tolerance of less than a width of one of the interconnects, the nest element having tapered walls extending upwardly and outwardly from edges of the pocket walls, the tapered walls being adapted to guide the chip into the pocket; and
activating one or more vibration inducing devices in communication with the nest element separately from actions performed to place the chip within the nest element to impart a vibratory motion to the chip through the walls of the nest element to cause the placed chip to be guided along the tapered walls into the pocket.

19. A method of testing a chip including the method of locating the chip as claimed in 18, further comprising clamping the nest element to a probe element having conductive contacts aligned to the pocket, clamping the chip to the probe element to establish conductive contact between the interconnects of the chip and the conductive contacts, and flowing currents through the conductive contacts and the interconnects of the chip to test the chip.

20. A method of simultaneously testing a plurality of chips, comprising:
arranging a plurality of probe apparatuses in an array, each probe apparatus including a nest element including a pocket having pocket walls dimensioned to locate one chip within a tolerance of less than a width of one of a plurality of exposed interconnects of the chip, each nest element having tapered walls extending upwardly and outwardly from edges of the pocket walls, the tapered walls being adapted to guide the chip into the pocket, the probe apparatuses further including probe elements having conductive contacts aligned to the pockets;

placing chips with at least coarse alignment into the nest elements of respective ones of the plurality of probe apparatuses such that each chip contacts at least some of the tapered walls of the nest element of each respective probe apparatus;

imparting vibratory motion to the chips through the walls of the nest elements of the respective probe apparatuses by actions separate from placement actions performed to place the chips, such that the chips are guided into the pockets of nest elements of the respective probe apparatuses;

clamping the chips to the respective probe elements to establish conductive contact between the interconnects of the chips and the conductive contacts of the probe elements; and applying voltages and flowing currents simultaneously through the conductive contacts of at least some of the probe apparatuses and the interconnects of at least some of the chips to simultaneously test at least some of the chips.

21. A method as claimed in claim 20, wherein said step of placing chips is performed by feeding out the chips individually from a feed mechanism carried by a robotic placer.

22. A method as claimed in claim 20, further comprising, after said step of applying voltages and flowing currents, collecting the chips into a take-up mechanism carried by a robotic placer.

23. A method as claimed in claim 22, further comprising, after said step of applying voltages and flowing currents, determining that individual ones of the chips do not show good test results and segregating those individual ones of the chips from others of the chips that show good test results.

* * * * *